(12) United States Patent
BrightSky et al.

(10) Patent No.: US 10,141,503 B1
(45) Date of Patent: Nov. 27, 2018

(54) SELECTIVE PHASE CHANGE MATERIAL GROWTH IN HIGH ASPECT RATIO DIELECTRIC PORES FOR SEMICONDUCTOR DEVICE FABRICATION

(71) Applicant: International Business Machines Corporation, Armonk, NY (US)

(72) Inventors: Matthew J. BrightSky, Pound Ridge, NY (US); Robert Bruce, White Plains, NY (US); Takeshi Masuda, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/803,349

(22) Filed: Nov. 3, 2017

(51) Int. Cl.
*H01L 45/00* (2006.01)

(52) U.S. Cl.
CPC .......... *H01L 45/1233* (2013.01); *H01L 45/06* (2013.01); *H01L 45/144* (2013.01); *H01L 45/1683* (2013.01); *H01L 45/124* (2013.01); *H01L 45/1246* (2013.01); *H01L 45/1253* (2013.01); *H01L 45/143* (2013.01); *H01L 45/1675* (2013.01)

(58) Field of Classification Search
CPC . H01L 45/06; H01L 45/1246; H01L 45/1253; H01L 45/1675; H01L 45/124; H01L 45/143
See application file for complete search history.

(56) References Cited

U.S. PATENT DOCUMENTS

| | | | |
|---|---|---|---|
| 5,814,527 A | 9/1998 | Wolstenholme et al. | |
| 7,382,647 B1* | 6/2008 | Gopalakrishnan | G11C 13/0007 365/100 |
| 7,879,645 B2 | 2/2011 | Lung et al. | |
| 8,101,456 B2 | 1/2012 | Breitwisch et al. | |
| 8,559,217 B2 | 10/2013 | Dubourdieu et al. | |
| 8,592,795 B2* | 11/2013 | Sandhu | G11C 11/5685 257/4 |
| 8,686,391 B2 | 4/2014 | Schrott et al. | |

(Continued)

OTHER PUBLICATIONS

J. Zhou et al., "Investigation of the Hydrogen Silsesquioxane (HSQ) Electron Resist as Insulating Material in Phase Change Memory Devices," Journal of Electronic Materials, vol. 44, No. 1, 2015, pp. 235-243.

(Continued)

*Primary Examiner* — Mohsen Ahmadi
(74) *Attorney, Agent, or Firm* — Garg Law Firm, PLLC; David M. Quinn

(57) ABSTRACT

A metal liner is deposited conformally to a pore within a first dielectric material of a semiconductor device. The pore extends through the first dielectric material to a top surface of a first metal electrode. The metal liner is etched such that the metal liner only substantially remains on sidewalls of the pore. A phase change material is selectively deposited within the pore of the first dielectric layer to substantially fill the pore with the phase change material. The selective deposition of the phase change material produces a growth rate of phase change material on the metal liner at a substantially greater rate than a growth rate of the phase change material on exposed surfaces of the first dielectric material.

14 Claims, 10 Drawing Sheets

(56) References Cited

U.S. PATENT DOCUMENTS

| | | | | |
|---|---|---|---|---|
| 8,728,859 | B2* | 5/2014 | Breitwisch | H01L 45/06 438/102 |
| 9,627,612 | B2* | 4/2017 | BrightSky | H01L 45/06 |
| 2012/0322223 | A1* | 12/2012 | Oh | H01L 45/06 438/382 |
| 2014/0070163 | A1* | 3/2014 | Nodin | H01L 45/06 257/4 |
| 2015/0041747 | A1* | 2/2015 | Kim | H01L 45/144 257/2 |
| 2015/0243884 | A1* | 8/2015 | BrightSky | H01L 45/06 257/4 |
| 2015/0340316 | A1* | 11/2015 | Or-Bach | G11C 5/025 257/2 |
| 2017/0141308 | A1* | 5/2017 | Park | H01L 45/1675 |
| 2017/0222141 | A1* | 8/2017 | BrightSky | H01L 45/124 |
| 2017/0236873 | A1* | 8/2017 | Chen | G11C 13/0069 438/382 |
| 2017/0331036 | A1* | 11/2017 | Collins | H01L 45/1658 |

OTHER PUBLICATIONS

W. Kim et al., "ALD-based confined PCM with a metallic liner toward unlimited endurance," IEEE International Electron Meeting, IEDM, 2016, 4.2 , 4 pages.

S. Kim et al., "A phase change memory cell with metallic surfactant layer as a resistance drift stabilizer," IEEE International Electron Devices Meeting, IEDM, 2013, 30.7, 4 pages.

G. W. Burr et al., "The inner workings of phase change memory: Lessons from prototype PCM devices," 2010 IEEE Globecom Workshops (GC Wkshps), Dec. 6-10, 2010, pp. 1890-1984.

* cited by examiner

SELECTIVE PHASE CHANGE MATERIAL GROWTH IN HIGH ASPECT RATIO DIELECTRIC PORES FOR SEMICONDUCTOR DEVICE FABRICATION

TECHNICAL FIELD

The present invention relates generally to a method for phase change material growth in semiconductor device fabrication and an apparatus formed by the method. More particularly, the present invention relates to a method for selective phase change material growth in high aspect ratio dielectric pores for semiconductor device fabrication and an apparatus formed by the method.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in rigid plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation is controlled to achieve the desired shape and electrical characteristics on the wafer.

Many semiconductor devices are planar, i.e., where the semiconductor structures are fabricated on one plane. A non-planar device is a three-dimensional (3D) device where some of the structures are formed above or below a given plane of fabrication.

Currently, a need exists for high density, high performance, memory devices that also have low power consumption. An emerging memory device technology is that of phase change memory. Phase change memory (PCM) is a type of nonvolatile random access memory (RAM). PCM exploits the behavior of a phase change material in which the phase change material is capable of transitioning between a crystalline phase and an amorphous phase responsive to an electrical current passing through the phase change material. Typically, in PCM fabrication the phase change material includes a chalcogenide compound such as germanium-antimony-tellurium (GST).

The PCM includes a region of phase change material disposed between a bottom electrode contact and a top electrode contact. The phase change material has a low resistivity when in the crystalline phase and a high resistivity when in the amorphous phase. To set the PCM in the amorphous phase, the phase change material is first melted and then quenched rapidly by applying a large electrical current pulse for short period of time leaving a region of amorphous, highly resistive material in the PCM cell. To set the PCM in the crystalline phase, a medium electrical current pulse is applied to anneal the phase change material at a temperature between the crystallization temperature and the melting temperature for a time period long enough to crystallize the phase change material having a relatively low resistivity. To read the state of the PCM, the resistivity of the cell is measured by passing a low current electrical signal through the cell which does not disturb the state of the phase change material. In addition, PCM technology has the ability to achieve a number of distinct intermediary states, thereby providing for the capability for PCM to hold multiple bits in a single cell providing for increased memory density.

Phase change memory device elements can be constructed in several ways. In one implementation, a planar phase change material film is deposited and pillars are lithographically defined and pattered into the phase change material by a plasma etching. Drawbacks of such implementations include that the phase change materials are sensitive to processing such as etching, cleaning, and encapsulation and can be damaged during device fabrication. In another implementation, patterned holes are formed in a dielectric material and phase change material is grown inside the holes. This implementation provides a good alternative to phase change memory pillars to avoid pillar damaged by post-processing. However a drawback of this implementation is that it is a large challenge to completely fill nanometer-sized, high aspect ratio holes required for high density memory elements.

Phase change materials can be deposited in number of ways such as by physical vapor deposition (PVD), chemical vapor deposition (CVD), plasma-enhanced chemical vapor deposition (PECVD), and metalorganic chemical vapor deposition (MOCVD). However, in all cases filling nanometer-sized, high aspect ratio holes are a challenge. Atomic layer deposition (ALD) is another technique that may be used to fill nanometer-sized, high aspect ratio holes. However, ALD has disadvantages in that layer-by-layer growth is slow and precursors can remain in the film after deposition. CVD processes in general are faster, but run into the incomplete fill problems. In addition, even layer-by-layer growth cannot completely fill re-entrant hole profiles. It has been found that ALD of phase change material proceeds faster and more uniformly on a metal seeding layer as compared to a dielectric seeding layer, so it is beneficial to grow the phase change material on a metal layer lining holes in the dielectric (i.e., a metal liner). Having a metal liner also has shown benefits to electrical resistance drift mitigation in PCM device operation.

Existing solutions for CVD deposition of phase change material, such as GST, on a metal liner exhibit a number of drawbacks. CVD deposition of amorphous GST on a metal liner can provide completely filled holes after deposition, but undergoes a volume shrinkage that introduces voids in the phase change material. CVD deposition of crystalline GST on a metal liner provides for crystal grain growth that is directional from nucleation sites, allowing for blocking and void formation within the phase change material. CVD deposition of nanocrystalline GST on a metal liner provides for the growth of small grains that allows possible complete filling of the holes. However, voids due to blocking still occur and the process window for nanocrystalline grain growth is very small.

The illustrative embodiments recognize that the present methods and techniques for growing phase change material in high aspect ratio dielectric pores for fabrication of a semiconductor device, such as a PCM device, presents the above described problems. Illustrative embodiments described herein provide for selective phase change material growth in high aspect ratio dielectric pores for semiconductor device fabrication providing a phase change memory device that is small (e.g., 20 nm critical dimension and smaller), has low reset current, has electrical resistance drift mitigation, and is void-free across the wafer yield.

SUMMARY

The illustrative embodiments provide a method and apparatus. An embodiment of a method for fabricating a semiconductor device includes depositing a metal liner conformally to a pore within a first dielectric material of the semiconductor device. In the embodiment, the pore extends through the first dielectric material to a top surface of a first metal electrode. The embodiment further includes etching the metal liner such that the metal liner only substantially remains on sidewalls of the pore. The embodiment further includes selectively depositing a phase change material within the pore of the first dielectric layer to substantially fill the pore with the phase change material. In the embodiment, the selective deposition of the phase change material produces a growth rate of phase change material on the metal liner at a substantially greater rate than a growth rate of the phase change material on exposed surfaces of the first dielectric material. An advantage provided by at least one embodiment includes fabrication of a semiconductor device having substantially void free filling of phase change material in the semiconductor device providing one or more of a low reset current and electrical resistance drift mitigation.

An embodiment further includes applying a vacuum during the depositing of the metal liner, etching of the metal liner, and the selective depositing of the phase change material. In an embodiment, the metal liner is deposited using a conformal atomic layer deposition growth process. In an embodiment, the metal liner includes a metal nitride. In an embodiment, the metal nitride includes one or more of tantalum (Ta), titanium (Ti), and aluminum (Al). In an embodiment, the metal liner is etched using a plasma etching process.

In an embodiment, the phase change material comprises a germanium-antimony-tellurium (GST) compound. In an embodiment, the selective deposition of the phase change material includes a selective deposition of an germanium-antimony-tellurium (GST) growth at a predetermined temperature. In an embodiment, the selective deposition includes one or more of a chemical vapor deposition (CVD), a pulsed CVD, and an atomic layer deposition (ALD).

An embodiment further includes applying a flow of a gas mixture at a particular flow rate during the selective depositing of the phase change material. In the embodiment, the gas mixture includes a mixture of ammonia (NH3) and argon (Ar).

An embodiment further includes forming a second metal electrode in contact with the phase change material. In an embodiment, the second metal electrode is formed using a deposition process. In an embodiment, the semiconductor device comprise a phase change memory device.

An embodiment of an apparatus includes a first metal electrode of a semiconductor device, and a first dielectric material including a pore within. In the embodiment, the pore extends through the first dielectric material to a top surface of the first metal electrode. The embodiment further includes a metal liner on sidewalls of the pore of the first dielectric material. In the embodiment, the metal liner is deposited conformally to the first dielectric material and etched such that the metal liner only substantially remains on the sidewalls of the pore. The embodiment further includes a phase change material selectively deposited within the pore of the first dielectric layer to substantially fill the pore with the phase change material. In the embodiment, the selective deposition of the phase change material produces a growth rate of phase change material on the metal liner substantially greater rate than a growth rate of the phase change material on exposed surfaces of the first dielectric material. An advantage provided by at least one embodiment includes a semiconductor device having substantially void free filling of phase change material in the semiconductor device providing one or more of a low reset current and electrical resistance drift mitigation.

In an embodiment, the metal liner includes a metal nitride. In an embodiment, the metal nitride includes one or more of tantalum (Ta), titanium (Ti), and aluminum (Al). In an embodiment, the phase change material comprises a germanium-antimony-tellurium (GST) compound.

Another embodiment further includes a second metal electrode in contact with the phase change material. In another embodiment, the semiconductor device comprises a phase change memory device.

An embodiment includes a computer usable program product. The computer usable program product includes one or more computer-readable storage devices, and program instructions stored on at least one of the one or more storage devices.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
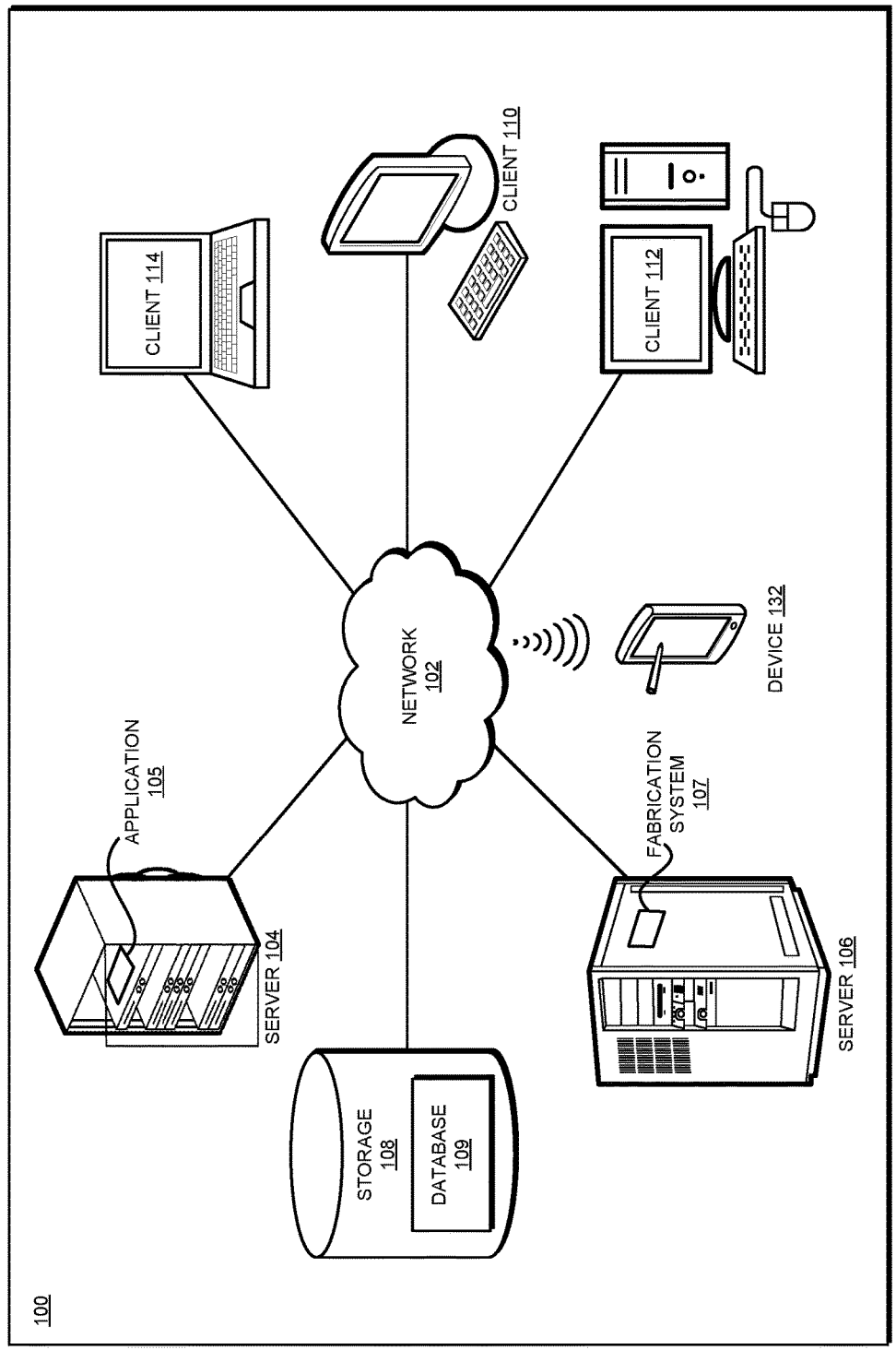
FIG. 1 depicts a block diagram of a network of data processing systems in which illustrative embodiments may be implemented.

The illustrative embodiments used to describe the invention generally address and solve the above-described problems and other problems related to phase change material growth in semiconductor device fabrication. In various illustrative embodiments, a controlled selective deposition growth of phase change material inside a pattern of dielectric pores is provided to facilitate fabrication of a phase change memory device or other suitable semiconductor device. In an embodiment, a conformal atomic layer deposition growth process is performed to deposit a thin metallic liner on one or more pores of a dielectric material, and plasma etching process of the metallic liner is performed so that the metallic liner is contained only on the pore sidewalls. In the embodiment, a pulsed, chemical vapor deposition of NH3-limited crystalline $Ge_xSb_yTe_z$ (GST) growth process is performed such that the GST preferentially grows on the metallic liner faster than the other exposed dielectric surfaces. In one or more embodiments, the processes are performed without a vacuum break between processes so that the metallic liner maintains its properties and there is no oxidized interface between the liner and the GST thus improving the electrical and/or performance properties of the phase change memory device such as low reset current, electrical resistance drift mitigation, and void-free phase change material growth within the phase change memory (PCM) device.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate a phase change memory device.

For the clarity of the description, and without implying any limitation thereto, the illustrative embodiments are described using a single PCM device. An embodiment can be implemented with a different number of PCM devices, a different memory device, or any other suitable semiconductor device within the scope of the illustrative embodiments. Furthermore, the dielectric pore can have its shape and geometrical orientation other than the ones found in the illustrative embodiments described herein. The PCM memory devices can be wired into a number of useful circuits such as CMOS logic circuits (e.g. NAND and NOR), memory cells (e.g. SRAM), analog circuits (e.g. PLL), and input/output (I/O) circuits.

Furthermore, a simplified diagram of the example PCM device is used in the figures and the illustrative embodiments. In an actual fabrication of a PCM device, additional structures that are not shown or described herein may be present without departing the scope of the illustrative embodiments. Similarly, within the scope of the illustrative embodiments, a shown or described structure in the example PCM device may be fabricated differently to yield a similar operation or result as described herein.

Differently shaded portions in the two-dimensional drawing of the example PCM device are intended to represent different structures in the example PCM device as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating a PCM device according to the illustrative embodiments.

Furthermore, the illustrative embodiments are described with respect to a PCM device only as an example. The steps described by the various illustrative embodiments can be adapted for fabricating other planar and non-planar devices, and such adaptations are contemplated within the scope of the illustrative embodiments.

An embodiment when implemented in a software application causes a fabrication system to performs certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a manufacturing device, tool, or data processing system, comprises substantial advancement of the functionality of that manufacturing device, tool, or data processing system in fabricating a PCM device as described herein.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
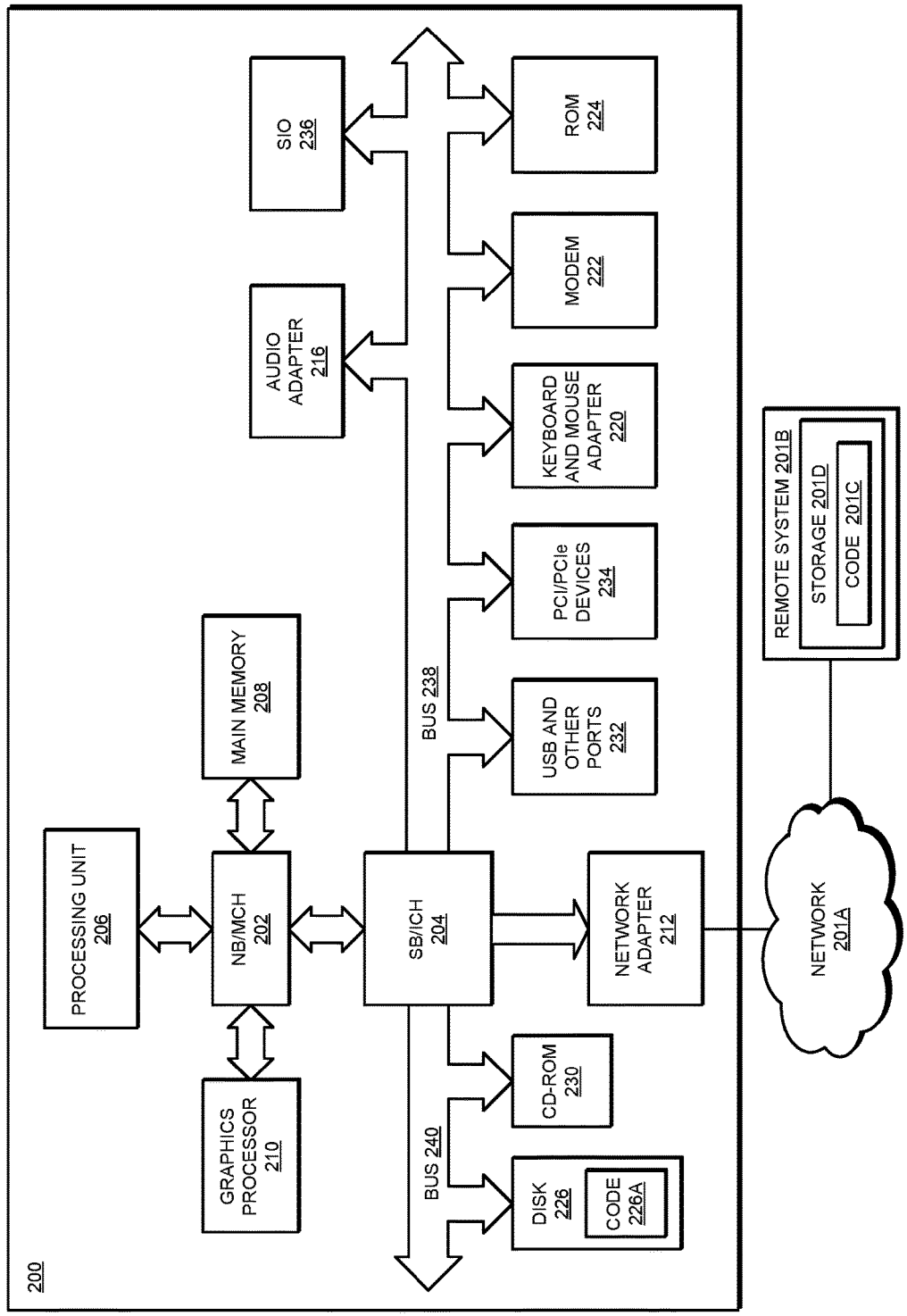
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108 including a database 109 Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication control system 107 is any suitable control system for controlling manufacturing equipment and sequencing process steps during fabrication of a semiconductor device. Fabrication control system 107 also implements an embodiment described herein. In a non-limiting example, application 105 represents a recipe program within a particular manufacturing device or tool. The recipe program controls tool physical process parameters (e.g. process temperature, ambient, pressure, precursor gas flows, process step duration, ion beam energy, ion beam dose, and others) during semiconductor substrate processing within a single manufacturing tool. In one or more embodiments, fabrication control system 107 controls the semiconductor substrate processing flow, i.e. fabrication control system 107 is responsible for selecting a sequence of manufacturing devices or tools and a proper recipe program or application 105 for each tool in the sequence. Accordingly, applications 105 and fabrication control system 107 provide instructions for fabricating PCM devices in a manner described herein.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. Instructions for the operating system, the object-oriented programming system, and applications or programs, such as application 105 and fabrication control system 107 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. In another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

Figure 3:
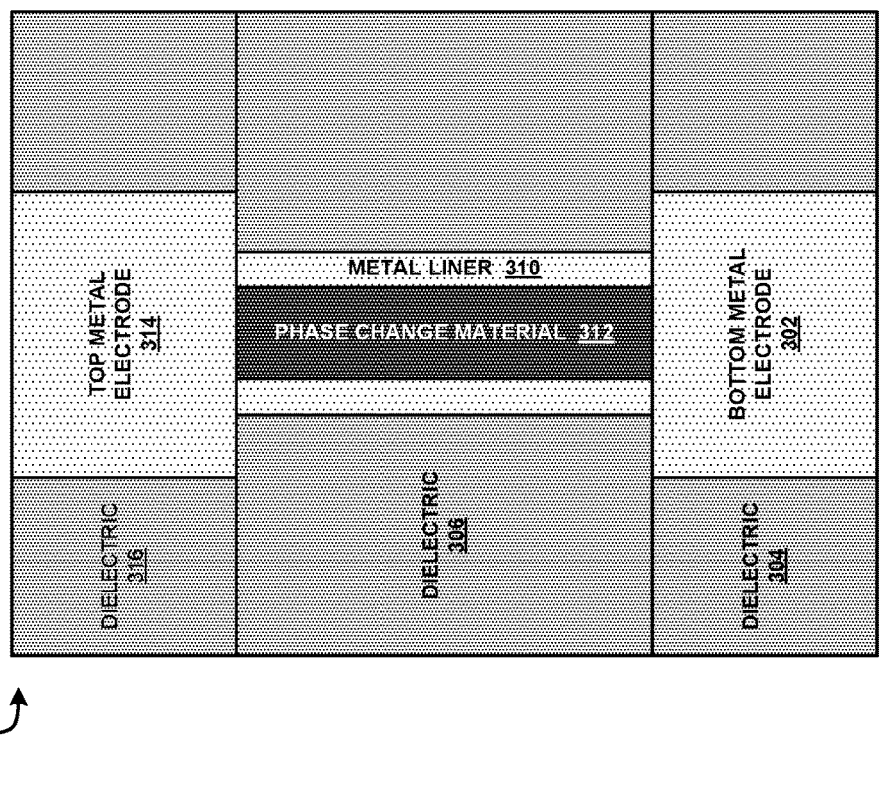
FIG. 3 depicts a cross-section view of an embodiment of a phase change memory device produced by a process according to an embodiment.

With reference to FIG. 3, FIG. 3 depicts a cross-section view of an embodiment of a phase change memory (PCM) device 300 produced by a process according to an embodiment of the present invention. PCM device 300 includes a bottom metal electrode 302 and a first dielectric material 304 disposed around one or more sides of bottom metal electrode 302. PCM device 300 further includes a metal liner 310 lining a pore through a second dielectric material 306 and a phase change material 312 disposed within the pore in contact with the metal liner 310 and the bottom metal electrode 302. In particular embodiments, phase change material 312 includes a GST compound. PCM device 300 further includes a top metal electrode 314 in contact with metal line 310 and phase change material 312, and a third dielectric material 316 disposed around sides of top metal electrode 314. Accordingly, phase change material 312 is disposed between bottom metal electrode 302 and top metal electrode 314.

With reference to FIGS. 4-9, these figures depict an example process for fabricating PCM device 300 in accordance with one or more illustrative embodiments. In the particular embodiments illustrated in FIGS. 4-9, a single PCM device 300 is fabricated. It should be understood that in other embodiments, any PCM devices and other semiconductor devices may be fabricated on a wafer in a similar manner.

Figure 4:
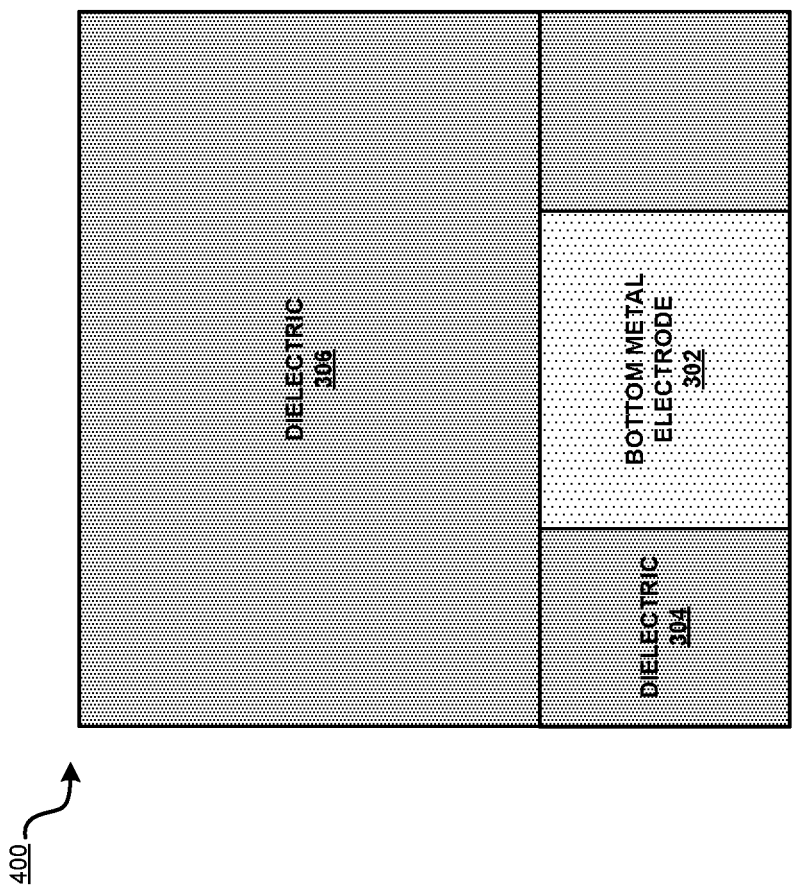
FIG. 4 depicts a portion of a process according to an illustrative embodiment.

With reference to FIG. 4, FIG. 4 depicts a portion of a process in which a structure 400 is formed according to an illustrative embodiment. In the illustrated embodiment, a manufacturing fabrication system controlled by application 105 and fabrication system 107 deposits first dielectric material 304, forms an opening in dielectric material 304, and deposits bottom metal electrode 304 within the opening. In the embodiment, fabrication system 107 polishes down bottom metal electrode 304. In the embodiment, fabrication system 107 deposits second dielectric material 306 upon an upper surface of bottom metal electrode 302 and first dielectric material 304.

In particular embodiments, first dielectric material 304 and second dielectric material 306 can be formed by suitable deposition processes, for example, CVD, plasma-enhanced chemical vapor deposition (PECVD), ALD, evaporation, PVD, chemical solution deposition, or other like processes. The thickness of the dielectric material can vary depending on the deposition process as well as the composition and number of dielectric materials used.

Figure 5:
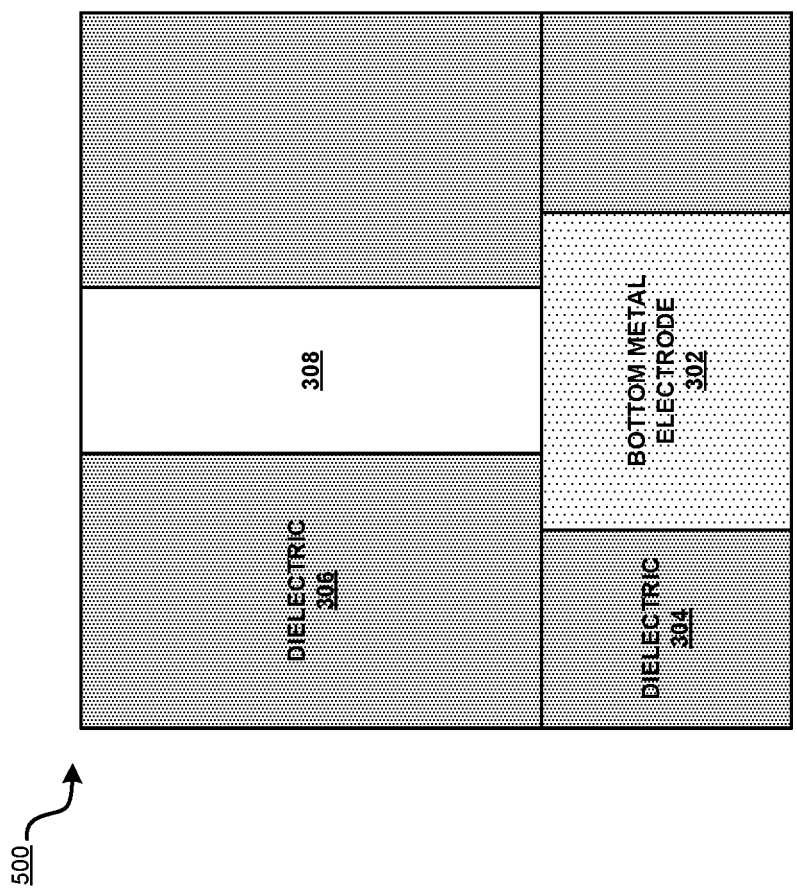
FIG. 5 depicts another portion of a process according to an illustrative embodiment.

With reference to FIG. 5, FIG. 5 depicts a portion of a process in which a structure 500 is formed according to an illustrative embodiment. In the illustrative embodiment, fabrication system 107 forms a pore 306 through second dielectric material 306 to the top surface of bottom metal electrode 302. In particular embodiments, fabrication system 107 forms a pore 306 using an etching process such as reactive ion etching (RIE), chemical etching, plasma etching or another suitable etching process.

Figure 6:
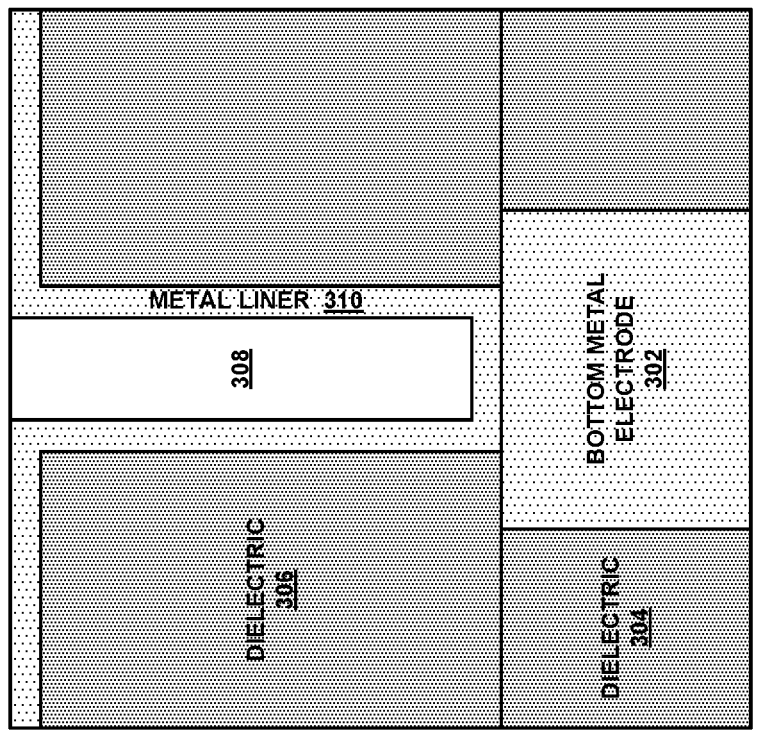
FIG. 6 depicts another portion of a process according to an illustrative embodiment.

With reference to FIG. 6, FIG. 6 depicts a portion of a process in which a structure 600 is formed according to an illustrative embodiment. In one or more embodiments, fabrication system 107 applies a vacuum to structure 500 of FIG. 5 and deposits a metal liner 310 on the exposed surfaces of second dielectric layer 306 including sidewalls of pore 308 using a conformal metal deposition process. In particular embodiments, fabrication system 107 uses a conformal atomic layer deposition growth process to deposit metal liner 310 on the exposed surfaces of second dielectric material 308. In a particular embodiment, metal liner 310 has a thickness of between 3-6 nanometers (nm). In one or more embodiments, the material of metal liner 310 includes a metal nitride. In particular embodiments, the metal nitride includes one or more of tantalum (Ta), titanium (Ti), aluminum (Al), their nitrides and combinations thereof such as TaN, TaTiN and TiAlN.

Figure 7:
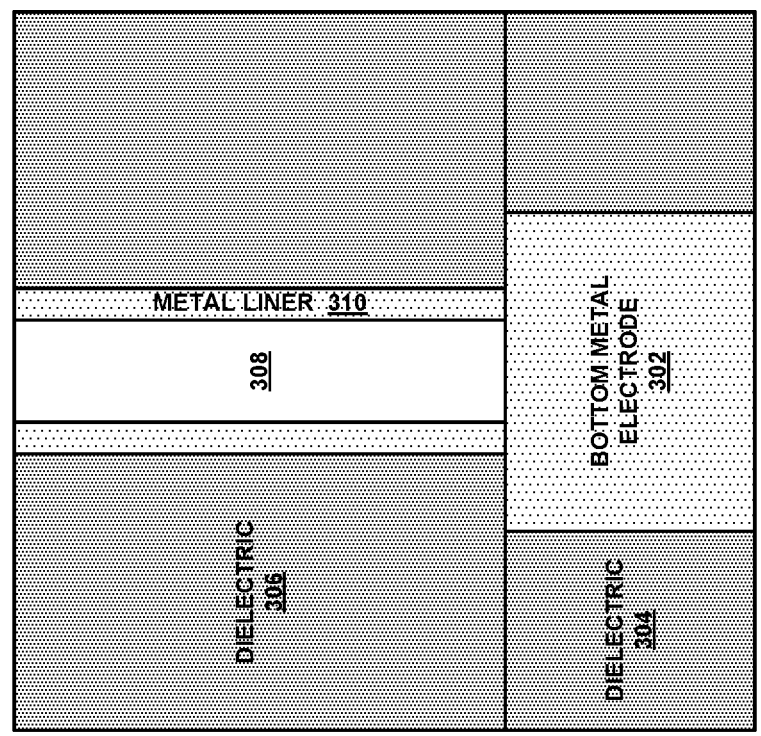
FIG. 7 depicts another portion of a process according to an illustrative embodiment.

With reference to FIG. 7, FIG. 7 depicts a portion of a process in which a structure 700 is formed according to an illustrative embodiment. In one or more embodiments, fabrication system 107 maintains the vacuum of FIG. 6, meaning there is no vacuum break between the process of FIG. 6 and the process of FIG. 7. In the embodiment, fabrication system 107 etches metal liner 310 using an etching process so that metal liner 310 only remains on the sidewalls of pore 308. In particular embodiments, fabrication system 107 uses a plasma etching process to etch metal liner 310.

Figure 8:
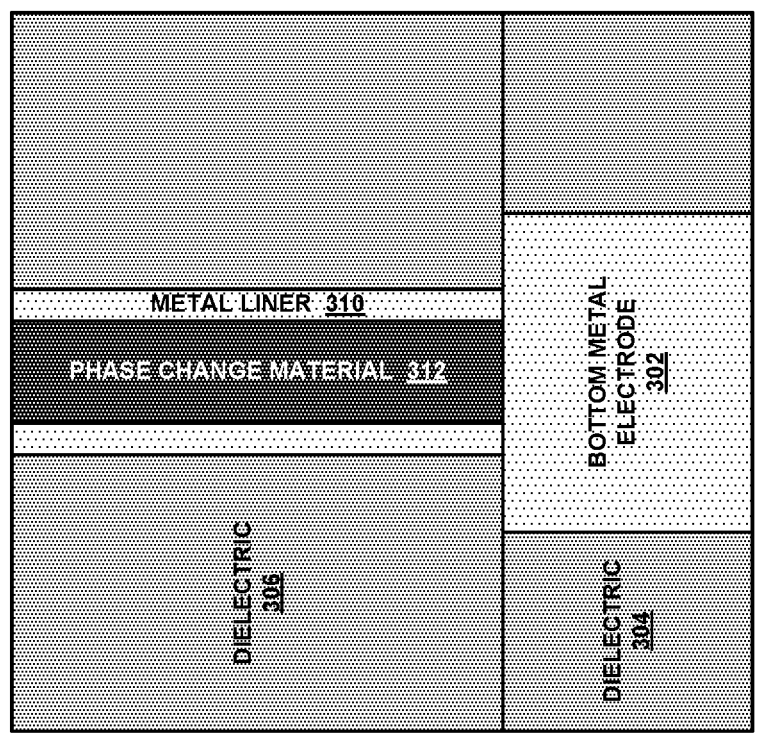
FIG. 8 depicts another portion of a process according to an illustrative embodiment.

With reference to FIG. 8, FIG. 8 depicts a portion of a process in which a structure 800 is formed according to an illustrative embodiment. In one or more embodiments, fabrication system 107 maintains the vacuum of FIG. 7, meaning there is no vacuum break between the process of FIG. 7 and the process of FIG. 8. In the embodiment, fabrication system 107 selectively deposits phase change material 312 within pore 308 of second dielectric layer 306 to substantially fill pore 308 with phase change material 312. In particular embodiment, the selective deposition of the phase change material includes one or more of a chemical vapor deposition (CVD), a pulsed CVD, and an atomic layer deposition (ALD). Selective deposition of phase change material 312 results in a growth rate of phase change material 312 on metal liner 310 at a substantially greater rate than the growth rate of phase change material 312 on exposed surfaces of second dielectric material 306. Accordingly, pore 308 is substantially filled with phase change material 312 with minimal deposition of phase change material 312 on other surfaces of structure 800. In particular embodiments, phase change material 312 includes a GST compound. In a particular embodiment, atomic layer deposition of a NH3-limited crystalline $Ge_xSb_yTe_z$ (GST) growth is used at a predetermined temperature so that GST preferentially grows on the metal liner 310 faster than on the other exposed dielectric surfaces. In one or more embodiments, a flow at a particular flow rate of a mixture of ammonia (NH3)/argon (Ar) is exposed to structure 800 during deposition of phase change material 312 to result in improved selectivity and growth of GST deposition and more complete filling of pore 308 with phase change material 312.

Figure 9:
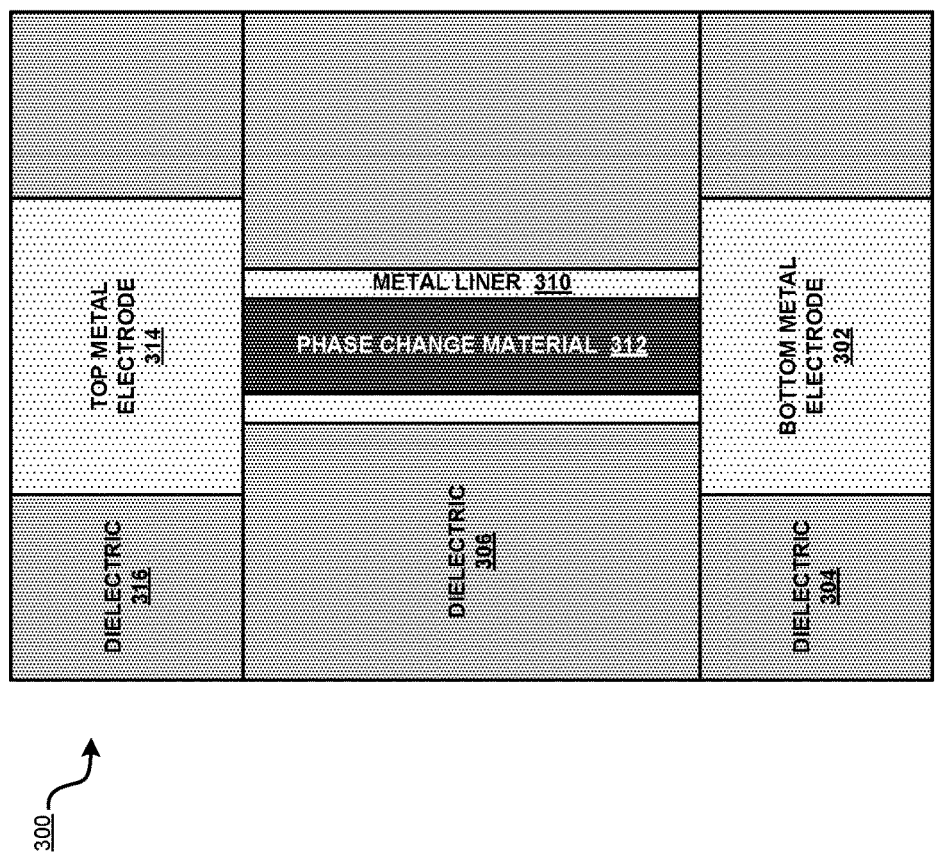
FIG. 9 depicts another portion of a process according to an illustrative embodiment.

With reference to FIG. 9, FIG. 9 depicts a portion of a process in which a PCM device 300 is formed according to an illustrative embodiment. In one or more embodiments, fabrication system 107 may release the previously applied vacuum. In one or more embodiments, fabrication system 107 deposits top metal electrode 314 upon a top surface of phase change material 312 and portions of a top surface of second dielectric material 306. In the embodiment, fabrication system 107 further deposits third dielectric material 316 around sides of top metal electrode 314. As a result of the processes described in FIGS. 4-9, PCM device 300 illustrated in FIG. 3 is fabricated according to one or more embodiments.

Figure 10:
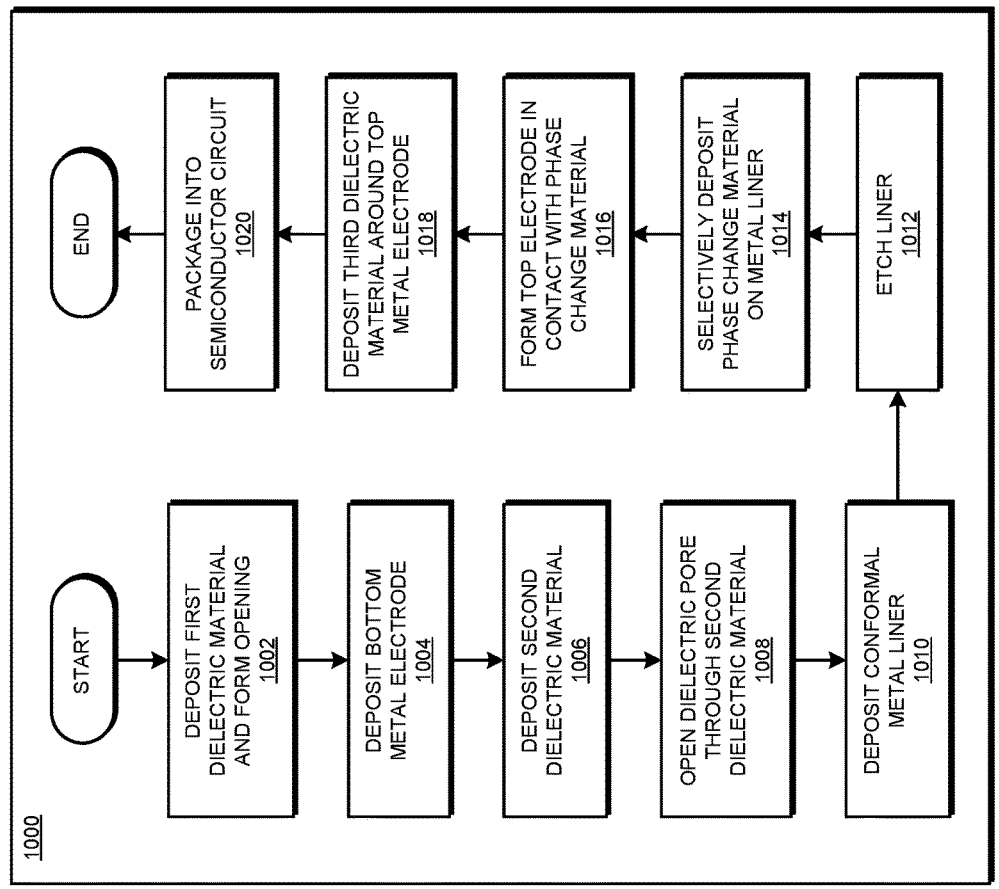
FIG. 10 depicts a flowchart of an example process for fabricating a phase change memory device in accordance with an illustrative embodiment.

With reference to FIG. 10, FIG. 10 depicts a flowchart of an example process 1000 for fabricating a phase change memory device in accordance with an illustrative embodiment. In block 1002, a manufacturing fabrication system controlled by application 105 and fabrication system 107 deposits first dielectric material 304 and forms and opening in first dielectric material 304. In block 1004, fabrication system 107 deposits bottom metal electrode 304 within the opening of first dielectric material 304.

In block 1006, fabrication system 107 deposits second dielectric material 306 upon first dielectric material 304 and bottom metal electrode 302. In block 1008, fabrication system 107 forms a pore 306 through second dielectric material 306 to the top surface of bottom metal electrode 302. In one or more embodiments, fabrication system 107 applies a vacuum to the structure during fabrication. In block 1010, fabrication system 107 deposits a metal liner 310 on the exposed surfaces of second dielectric layer 306 including sidewalls of pore 308 using a conformal metal deposition process. In block 1012, fabrication system 107 etches metal liner 310 using an etching process so that metal liner 310 only substantially remains on the sidewalls of pore 308.

In block 1014, fabrication system 107 selectively deposits phase change material 312 within pore 308 of second dielectric layer 306 to substantially fill pore 308 with phase change material 312. Selective deposition of phase change material 312 results in a growth rate of phase change material 312 on metal liner 310 at a substantially greater rate than the growth rate of phase change material 312 on exposed surfaces of second dielectric material 306. Accordingly, pore 308 is substantially filled with phase change material 312 with minimal deposition of phase change material 312 on other surfaces of structure 800. In one or more embodiments, fabrication system 107 applies a flow at a particular flow rate of a gas mixture of ammonia (NH3)/argon (Ar) to the structure during deposition of phase change material 312 to result in improved selectivity and growth of phase material deposition and more complete filling of pore 308 with phase change material 312. In other particular embodiments, other gas mixtures may be used to improve selectivity and growth of phase material deposition. In one or more embodiments, fabrication system 107 may release the previously applied vacuum.

In block 1016, fabrication system 107 forms top metal electrode 314 in contact with a top surface of phase change material 312. In particular embodiments, fabrication system 107 forms top metal electrode 314 using deposition. In block 1018, fabrication system 107 deposits third dielectric material 316 around sides of top metal electrode 314. In block 1020, fabrication system 107 packages the resulting structure into a semiconductor circuit to form PCM device 300 of FIG. 3.

Thus, a computer implemented method, system or apparatus, and computer program product are provided in the illustrative embodiments for fabricating a PCM device using selective phase change material growth and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for fabricating a phase change memory (PCM) device comprising:
    depositing a first dielectric material;
    forming an opening in the first dielectric material;
    depositing a bottom metal electrode within the opening and polishing the bottom metal electrode;
    depositing a second dielectric material on a surface of the bottom metal electrode and the first dielectric material;
    depositing a metal nitride conformally to a pore within the second dielectric material of the phase change memory (PCM) device, the pore extending through the second dielectric material and exposing a portion of a top surface of the bottom metal electrode;
    etching the metal nitride such that the metal nitride only and directly remains on an entire sidewalls of the pore, exposing the portion of the top surface of the bottom metal electrode after the etching of the metal nitride; and
    selectively depositing a phase change material only within the pore of the second dielectric layer to completely fill an entire of the pore with the phase change material, the selective deposition of the phase change material producing a growth rate of phase change material on the metal nitride at a substantially greater rate than a growth rate of the phase change material on exposed surfaces of the second dielectric material;
    applying a vacuum during the depositing of the metal nitride, etching of the metal nitride, and the selective depositing of the phase change material;
    depositing a top metal electrode in contact with a top surface of the phase change material and in contact with portions of a top surface of second dielectric material; and
    depositing a third dielectric material, the third dielectric material is in contact with sidewalls of the top metal electrode.

2. The method of claim 1, wherein the metal nitride is deposited using a conformal atomic layer deposition growth process.

3. The method of claim 1, wherein the metal nitride includes one or more of tantalum (Ta), titanium (Ti), and aluminum (Al).

4. The method of claim 1, wherein the metal nitride is etched using a plasma etching process.

5. The method of claim 1, wherein the phase change material comprises a germanium-antimony-tellurium (GST) compound.

6. The method of claim 1, wherein the selective deposition of the phase change material includes a selective deposition of a germanium-antimony-tellurium (GST) growth at a predetermined temperature.

7. The method of claim 1, wherein the selective deposition includes one or more of a chemical vapor deposition (CVD), a pulsed CVD, and an atomic layer deposition (ALD).

8. The method of claim 7, wherein the gas mixture includes a mixture of ammonia (NH3) and argon (Ar).

9. The method of claim 1, further comprising:
    applying a flow of a gas mixture at a particular flow rate during the selective depositing of the phase change material.

10. The method of claim 1, wherein the second metal electrode is formed using a deposition process.

11. A phase change memory (PCM) device comprising:
a first dielectric material;
an opening in the first dielectric material;
a bottom metal electrode deposited within the opening and polished;
a second dielectric material deposited on a surface of the bottom metal electrode and the first dielectric material;
a metal nitride conformally deposited to a pore within the second dielectric material of a phase change memory (PCM) device, the pore extending through the second dielectric material and exposing a portion of a top surface of the bottom metal electrode,
wherein the metal nitride is etched such that the metal nitride only and directly remains on an entire sidewalls of the pore, exposing the portion of the top surface of the bottom metal electrode after the etching of the metal nitride; and
a phase change material selectively deposited only within the pore of the second dielectric layer to completely fill an entire of the pore with the phase change material, the selective deposition of the phase change material producing a growth rate of phase change material on the metal nitride at a substantially greater rate than a growth rate of the phase change material on exposed surfaces of the second dielectric material,
wherein a vacuum is applied during the depositing of the metal nitride, etching of the metal nitride, and the selective depositing of the phase change material;
a top metal electrode deposited and is in contact with a top surface of the phase change material and in contact with portions of a top surface of second dielectric material; and
a third dielectric material deposited and is in contact with sidewalls of the top metal electrode.

12. The phase change memory device of claim 11, wherein the metal nitride includes one or more of tantalum (Ta), titanium (Ti), and aluminum (Al).

13. The phase change memory device of claim 11, wherein the phase change material comprises a germanium-antimony-tellurium (GST) compound.

14. The phase change memory device of claim 11, further comprising:
a second metal electrode in contact with the phase change material.

* * * * *